United States Patent
Yu et al.

(10) Patent No.: US 11,205,726 B2
(45) Date of Patent: Dec. 21, 2021

(54) THIN FILM TRANSISTOR AND MANUFACTURING METHOD THEREOF, GATE DRIVING CIRCUIT, DISPLAY SUBSTRATE AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Jufeng Yu, Beijing (CN); Ling Han, Beijing (CN); Tao Ma, Beijing (CN); Chengshao Yang, Beijing (CN); Lin Chen, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/835,948

(22) Filed: Mar. 31, 2020

(65) Prior Publication Data
US 2021/0167217 A1     Jun. 3, 2021

(30) Foreign Application Priority Data
Nov. 29, 2019   (CN) .......................... 201922106072.5

(51) Int. Cl.
*H01L 29/786*     (2006.01)
*H01L 29/417*     (2006.01)
*G09G 3/20*       (2006.01)
*H01L 29/66*      (2006.01)
*G11C 19/28*      (2006.01)
*H01L 21/285*     (2006.01)

(52) U.S. Cl.
CPC ......... *H01L 29/78618* (2013.01); *G09G 3/20* (2013.01); *G11C 19/28* (2013.01); *H01L 21/28506* (2013.01); *H01L 29/41733* (2013.01); *H01L 29/66742* (2013.01)

(58) Field of Classification Search
CPC ............ H01L 29/78636; H01L 29/458; H01L 29/78618; H01L 29/41733; H01L 29/66765; H01L 29/78696; H01L 29/4908
See application file for complete search history.

(56) References Cited

U.S. PATENT DOCUMENTS

| | | | | |
|---|---|---|---|---|
| 2009/0039352 | A1* | 2/2009 | Kobayashi | H01L 29/78696 257/59 |
| 2018/0197901 | A1* | 7/2018 | Sun | H01L 21/02592 |
| 2019/0123209 | A1* | 4/2019 | Zeng | H01L 29/78618 |

* cited by examiner

*Primary Examiner* — Mohammed R Alam
(74) *Attorney, Agent, or Firm* — Nath, Goldberg & Meyer; Joshua B. Goldberg

(57) ABSTRACT

The present disclosure provides a thin film transistor, including: an active layer, a source and a drain electrically coupled with the active layer, and a plurality of doped layers located between the source and the active layer and between the drain and the active layer, a resistance of one of the plurality of doped layers farthest away from the active layer is smaller than that of any other doped layer. The disclosure further provides a gate driving circuit, a display substrate and a display device. With the present disclosure, current loss of a current passing through the doped layers of the thin film transistor is reduced, on-state current of the thin film transistor is improved and a situation that output signals of the thin film transistor are insufficient is avoided.

16 Claims, 2 Drawing Sheets

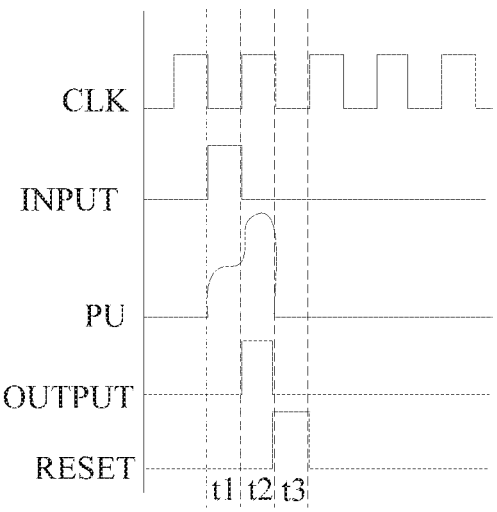

FIG 4 forming a plurality of doped layers between the source and the active layer and between the drain and the active layer, a resistance of one of the doped layers which is farthest away from the active layer is smaller than that of any other doped layer —— 501

FIG 5 forming the source and the drain as comb-shaped electrodes, where the source includes a first comb-handle portion and a plurality of first comb-tooth portions electrically coupled to the first comb-handle portion, the drain includes a second comb-handle portion and a plurality of second comb-tooth portions electrically coupled to the second comb-handle portion, and the plurality of first comb-tooth portions and the plurality of second comb-tooth portions are alternately arranged at intervals. —— 601

FIG 6

THIN FILM TRANSISTOR AND MANUFACTURING METHOD THEREOF, GATE DRIVING CIRCUIT, DISPLAY SUBSTRATE AND DISPLAY DEVICE

CROSS-REFERENCE TO RELATED APPLICATIONS

The present disclosure claims priority to Chinese patent publication No. 201922106072.5, filed on Nov. 29, 2019, the contents of which is incorporated herein by reference.

TECHNICAL FIELD

The disclosure relates to the field of display technology, and particularly relates to a thin film transistor and a manufacturing method thereof, a gate driving circuit, a display substrate and a display device.

BACKGROUND

At present, in the process of manufacturing a display substrate, an on-state current of a thin film transistor positioned in the central area of a display substrate motherboard is small, when the display substrate at the central position is applied to a vehicle-mounted display device, since the vehicle-mounted display device is small in size and operates in an complex environment (such as low temperature of 40 degrees below zero), the on-state current of the thin film transistor is further reduced, the problems that input and output signals of the thin film transistor are insufficient and the display substrate cannot normally display are caused.

SUMMARY

An embodiment of the present disclosure provides a thin film transistor, including: an active layer; a source and a drain electrically coupled to the active layer, and a plurality of doped layers respectively located between the source and the active layer and between the drain and the active layer, and a resistance of one of the doped layers farthest away from the active layer is smaller than that of any other doped layer.

In some implementations, resistances of the plurality of doped layers increases gradually in a direction from the source and the drain towards the active layer.

In some implementations, contents of dopants in the plurality of doped layers are decreased gradually in a direction from the source and the drain towards the active layer.

In some implementations, a thickness of each of the plurality of doped layers ranges from 100 Å to 200 Å.

In some implementations, three doped layers are disposed between the source and the active layer and between the drain and the active layer respectively.

In some implementations, the source and the drain are both comb-shaped electrodes, the source includes a first comb-handle portion and a plurality of first comb-tooth portions electrically coupled to the first comb-handle portion, the drain includes a second comb-handle portion and a plurality of second comb-tooth portions electrically coupled to the second comb-handle portion, and the plurality of first comb-tooth portions and the plurality of second comb-tooth portions are alternately arranged at intervals.

In some implementations, an interval between two adjacent first comb-tooth portion and second comb-tooth portion ranges from 3.5 to 4.5 micrometers.

An embodiment of the present disclosure provides a thin film transistor, including: an active layer, a source and a drain electrically coupled to the active layer, where the source and the drain are both comb-shaped electrodes, the source includes a first comb-handle portion and a plurality of first comb-tooth portions electrically coupled to the first comb-handle portion, the drain includes a second comb-handle portion and a plurality of second comb-tooth portions electrically coupled to the second comb-handle portion, and the plurality of first comb-tooth portions and the plurality of second comb-tooth portions are alternately arranged at intervals.

In some implementations, an interval between the first comb-tooth portion and the second comb-tooth portion which are adjacent to each other ranges from 3.5 micrometers to 4.5 micrometers.

In some implementations, the number of the first comb-tooth portions of the source ranges from 5 to 10, and the number of the second comb-tooth portions of the drain ranges from 6 to 11.

An embodiment of the present disclosure provides a gate driving circuit including a plurality of thin film transistors, at least one of the plurality of thin film transistors being the above thin film transistor.

An embodiment of the present disclosure provides a display substrate including the above gate driving circuit.

An embodiment of the present disclosure provides a display device including the above display substrate.

An embodiment of the present disclosure provides a manufacturing method of the above thin film transistor, including: forming a plurality of doped layers between the source and the active layer and between the drain and the active layer respectively, wherein a resistance of one of the doped layers farthest away from the active layer is smaller than that of any other doped layer.

In some implementations, the manufacturing method further includes:

forming the source and the drain as comb-shaped electrodes, where the source includes a first comb-handle portion and a plurality of first comb-tooth portions electrically coupled to the first comb-handle portion, the drain includes a second comb-handle portion and a plurality of second comb-tooth portions electrically coupled to the second comb-handle portion, and the plurality of first comb-tooth portions and the plurality of second comb-tooth portions are alternately arranged at intervals.

An embodiment of the present disclosure provides a manufacturing method of the above thin film transistor, including: forming both the source and the drain as comb-shaped electrodes, where the source includes a first comb-handle portion and a plurality of first comb-tooth portions electrically coupled to the first comb-handle portion, the drain includes a second comb-handle portion and a plurality of second comb-tooth portions electrically coupled to the second comb-handle portion, and the plurality of first comb-tooth portions and the plurality of second comb-tooth portions are alternately arranged at intervals.

DESCRIPTION OF DRAWINGS

The accompanying drawings are used to provide a further understanding of the disclosure and form a part of the specification, and are used to explain the disclosure together with the following specific embodiments, but do not constitute a limitation of the disclosure. In the drawings:

FIG. 4 is a timing diagram of a shift register unit according to an embodiment of the present disclosure;

FIG. 5 is a flowchart of a method of manufacturing a thin film transistor according to an embodiment of the present disclosure; and FIG. 6 is a flowchart of a method of manufacturing a thin film transistor according to an embodiment of the present disclosure.

DESCRIPTION OF EMBODIMENTS

The specific embodiments of the present disclosure will be described in detail below in combination with the accompanying drawings. It should be understood that the specific embodiments described herein are only used to illustrate and interpret the disclosure and are not used to limit the disclosure.

Figure 1:
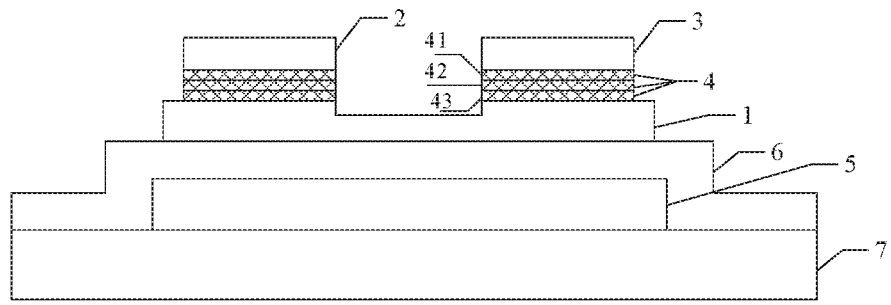
FIG. 1 is a schematic partial structure diagram of a thin film transistor according to an embodiment of the present disclosure.

An embodiment of the present disclosure provides a thin film transistor, and FIG. 1 is a schematic structural diagram of the thin film transistor provided in the embodiment of the present disclosure. As shown in FIG. 1, the thin film transistor includes: an active layer 1, a source 2 and a drain 3 which are electrically coupled with the active layer 1, and a plurality of doped layers 4 disposed between the source 2 and the active layer 1 and between the drain 3 and the active layer 1, and a resistance of one of the doped layers 4 which is farthest away from the active layer 1 is smaller than that of any other doped layer 4.

In an embodiment of the present disclosure, the doped layers 4 are disposed between the active layer 1 and the source 2 and between the active layer 1 and the drain 3, so that the impedances between the active layer 1 and the source 2 and between the active layer 1 and the drain 3 can be reduced, metal semiconductor (MS) structures are formed by the active layer 1, the doped layers 4 and the source 2, and by the active layer 1, the doped layers 4 and the drain 3, a current is input and output through the doped layers 4 and the active layer 1 after passing through the source 2 or the drain 3. The doped layers 4 are disposed between the source 2 and the active layer 1 and between the drain 3 and the active layer 1, and the resistance of one of the doped layers 4 farthest away from the active layer 1 is smaller than that of any other doped layer 4, so that the resistances of the doped layers 4 close to the source 2 and the drain 3 are relative small, that is, the resistance of the doped layer 4 close to the source 2 is similar to that of the source 2, and the resistance of the doped layer 4 close to the drain 3 is similar to that of the drain 3, thus a potential field between the source 2 and the doped layer 4 close to the source 2 and a potential field between the drain 3 and the doped layer 4 close to the drain 3 can be reduced, and a contact resistance between the source 2 and the doped layer 4 close to the source 2 and a contact resistance between the drain 3 and the doped layer 4 close to the drain 3 are reduced. A resistance of the doped layer 4 close to the active layer 1 is relative large, that is, the resistance of the doped layer 4 close to the active layer 1 is similar to that of the active layer 1, so that the potential field between the active layer 1 and the doped layer 4 close to the active layer 1 can be reduced, and a contact resistance between the active layer 1 and the doped layer 4 close to the active layer 1 can be reduced.

In the thin film transistor of the embodiment, the plurality of doped layers 4 are provided, and among the plurality of doped layers 4, the contact resistances between the source 2 and the drain 3 and the doped layers 4 close to the source 2 and the drain 3 are relative small, and the contact resistance between the doped layer 4 close to the active layer 1 and the active layer 1 is relative large, so that the current loss when the current passes through the doped layers can be reduced, the on-state current of the thin film transistor is improved, and the situation that the output signal of the thin film transistor is insufficient is avoided.

It should be noted that, the thin film transistor may further include a gate 5, a gate insulating layer 6, and a base 7. The gate, the gate insulating layer and the active layer forms a metal-insulator-semiconductor (MIS) structure.

In some implementations, the resistances of the doped layers 4 increases gradually along a direction from the source/drain to the active layer 1, so that the resistances of any two adjacent doped layers 4 in the direction are similar, the contact resistance between any two adjacent doped layers 4 is reduced, and the on-state current of the thin film transistor is further increased. Specifically, contents of dopants in the plurality of doped layers 4 may be gradually decreased along the direction from the source/drain to the active layer 1.

In an implementation of the present disclosure, the resistances of the doped layers 4 close to the source 2 and the drain 3 may be reduced by increasing the contents of dopants in these doped layers 4 to reduce the potential field between the doped layer 4 and the source 2 and the potential field between the doped layer 4 and the drain 3, thereby reducing the contact resistance between the source 2 and the doped layer 4 close to the source 2 and the contact resistance between the drain 3 and the doped layer 4 close to the drain 3. The resistance of the doped layer 4 close to the active layer 1 is increased by lowering the doping concentration of the dopants in the doped layer 4, thereby reducing the potential field between the doped layer 4 and the active layer 1 and thus lowering the contact resistance between the doped layer 4 and the active layer 1. Further, since the contents of the dopants in the plurality of doped layers 4 are gradually reduced along the direction from the source/drain to the active layer 1, the resistances of any two doped layers 4 are similar, the contact resistance between any two adjacent doped layers 4 is relative small, and the on-state current of the thin film transistor is further increased.

In an embodiment of the present disclosure, each of the doped layers 4 may be a semiconductor doped layer, the semiconductor may be silicon (Si), germanium (Ge), gallium arsenide (GaAs), etc., and silicon may be selected generally for cost saving. The semiconductor doped layer may be an n-type semiconductor doped layer or a p-type semiconductor doped layer. Specifically, the n-type semiconductor doped layer may be silicon (Si) doped with phosphorus (P), arsenic (As), bismuth (Bi), antimony (Sb), or the like, and the P-type semiconductor doped layer may be silicon (Si) doped with boron (B), gallium (Ga), indium (Zn), or the like.

In some specific implementations, a thickness of each doped layer 4 may range from 100 Å to 200 Å, thereby preventing relative large loss of current in the doped layer 4 due to too large thickness of the doped layer 4, while also effectively reducing the impedance between the active layer 1 and the source 2 and the impedance between the active layer 1 and the drain 3.

In some implementations, three doped layers 4 are disposed between the source 2 and the drain 3 and the active layer 1. The three doped layers 4 include: a first doped layer 41, a second doped layer 42, and a third doped layer 43 sequentially disposed in a direction from the source 2 and the drain 3 towards the active layer 1, as shown in FIG. 1. The first doped layer 41 has the largest content of dopant, the second doped layer 42 has the second largest content of dopant, and the third doped layer 43 has the smallest content of dopant. Certainly, in other implementations, the number of the doped layers 4 is not limited to three, and may be, for example, five or seven, as long as the contents of the dopants in the doped layers 4 are gradually decreased in the direction from the source 2 and drain 3 to the active layer 1.

Figure 2:
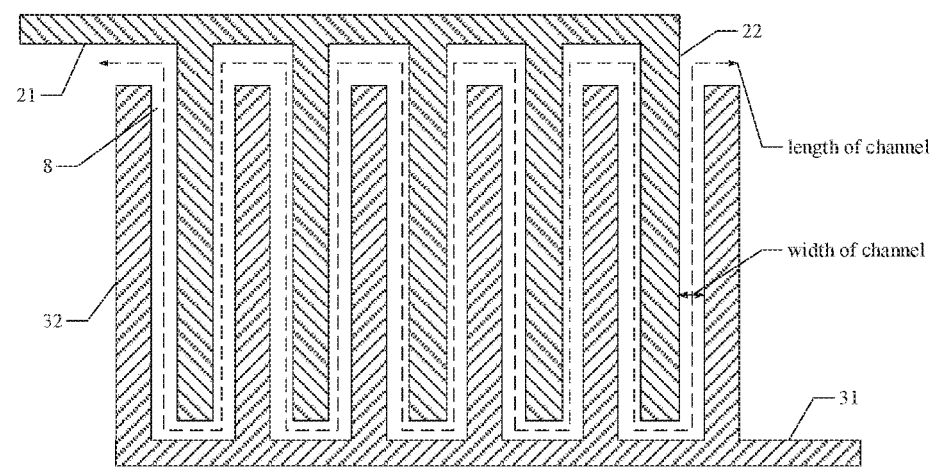
FIG. 2 is a schematic structural diagram of a source and a drain in an embodiment of the present disclosure.

FIG. 2 is a schematic structural diagram of a source and a drain of the thin film transistor shown in FIG. 1, as shown in FIG. 2, the source 2 and the drain 3 are both comb-shaped electrodes, the source 2 includes a first comb-handle portion 21 and a plurality of first comb-tooth portions 22 electrically coupled to the first comb-handle portion 21, the drain 3 includes a second comb-handle portion 31 and a plurality of second comb-tooth portions 32 electrically coupled to the second comb-handle portion 31, and the plurality of first comb-tooth portions 22 and the plurality of second comb-tooth portions 32 are alternately arranged at intervals.

Specifically, a channel 8 is formed by an interval between the first comb-tooth portion 22 and the second comb-tooth portion 32, and after a current is supplied to the source 2 and the drain 3, the channel 8 between the first comb-tooth portion 22 and the second comb-tooth portion 32 constitutes a conductive channel of the thin film transistor, a length (dotted arrow in the figure) of the channel 8 is the width of the conductive channel, and a width (solid arrow in the figure) of the channel 8 is the length of the conductive channel. According to the calculation formula of the on-state current of the thin film transistor, $$Ion = \frac{1}{2}k*\frac{W}{L}(Vgs-Vth)^2$$

where k is a coefficient and may be determined according to device parameters of the thin film transistor, W is the width of the conductive channel of the thin film transistor, L is the length of the conductive channel of the thin film transistor, Vgs is a gate-source voltage of the thin film transistor, and Vth is a threshold voltage of the thin film transistor, it can be obtained that the on-state current Ion of the thin film transistor is in positive correlation with the width-to-length ratio of the conductive 10 channel of the thin film transistor, therefore, the on-state current of the thin film transistor may be increased by increasing the number of the first comb-tooth portions 22 and the second comb-tooth portions 32 to prolong the length of the channel 8, that is, to increase the width of the conductive channel, and thus increasing the width-to-length ratio of the conductive channel of the thin film transistor. Alternatively, the on-state current of the thin film transistor may be increased by reducing the interval between the first comb-tooth portion 22 and the second comb-tooth portion 32 which are adjacent to each other, to reduce the length of the conductive channel and thereby increasing the width-to-length ratio of the conductive channel of the thin film transistor. Specifically, the interval between the first comb-tooth portion 22 and the second comb-tooth portion 32 which are adjacent to each other may range from 3.5 micrometers to 4.5 micrometers.

An embodiment of the present disclosure also provides a thin film transistor, as shown in FIG. 2, including: an active layer 1, a source 2 and a drain 3 which are electrically coupled with the active layer 1, where the source 2 and the drain 3 are both comb-shaped electrodes, the source 2 includes a first comb-handle portion 21 and a plurality of first comb-tooth portions 22 electrically coupled with the first comb-handle portion 21, the drain 3 includes a second comb-handle portion 31 and a plurality of second comb-tooth portions 32 electrically coupled with the second comb-handle portion 31, and the plurality of first comb-tooth portions 22 and the plurality of second comb-tooth portions 32 are alternately arranged at intervals.

Specifically, a channel 8 is formed by an interval between the first comb-tooth portion 22 and the second comb-tooth portion 32, and after a current is supplied to the source 2 and the drain 3, the channel 8 between the first comb-tooth portion 22 and the second comb-tooth portion 32 constitutes a conductive channel of the thin film transistor, a length (dotted arrow in the figure) of the channel 8 is the width of the conductive channel, and a width (solid arrow in the figure) of the channel 8 is the length of the conductive channel. According to the calculation formula of the on-state current of the thin film transistor, $$Ion = \frac{1}{2}k*\frac{W}{L}(Vgs-Vth)^2$$

where k is a coefficient and may be determined according to device parameters of the thin film transistor, W is the width of the conductive channel of the thin film transistor, L is the length of the conductive channel of the thin film transistor, Vgs is a gate-source voltage of the thin film transistor, and Vth is a threshold voltage of the thin film transistor, it can be obtained that the on-state current Ion of the thin film transistor is in positive correlation with the width-to-length ratio of the conductive channel of the thin film transistor, therefore, the on-state current of the thin film transistor may be increased by increasing the number of the first comb-tooth portions 22 and the second comb-tooth portions 32 to prolong the length of the channel 8, that is, to increase the width of the conductive channel, and thus increasing the width-to-length ratio of the conductive channel of the thin film transistor. Alternatively, the on-state current of the thin film transistor may be increased by reducing the interval between the first comb-tooth portion 22 and the second comb-tooth portion 32 which are adjacent to each other, to reduce the length of the conductive channel and thereby increasing the width-to-length ratio of the conductive channel of the thin film transistor. Specifically, the interval between the first comb-tooth portion 22 and the second comb-tooth portion 32 which are adjacent to each other may range from 3.5 micrometers to 4.5 micrometers.

In some specific implementations, the interval between the first comb-tooth portion 22 and the second comb-tooth portion 32 which are adjacent to each other may be reduced, and specifically, the interval between the first comb-tooth portion 22 and the second comb-tooth portion 32 which are adjacent to each other may ranges from 3.5 micrometers to 4.5 micrometers. In some specific implementations, the number of the first comb-tooth portions 22 and the second comb-tooth portions 32 may also be increased, specifically, the number of the first comb-tooth portions 22 of the source 2 may range from 5 to 10, and the number of the second comb-tooth portions 32 of the drain 3 may range from 6 to 11, as shown in FIG. 2, since the number of the second comb-tooth portions 32 of the drain 3 is greater than the number of the first comb-tooth portions 22 of the source 2, when the source and the drain are arranged, all the first comb-tooth portions 22 of the source 2 are located between two outermost comb-tooth portions of the second comb-tooth portions 32 of the drain 3.

Figure 3:
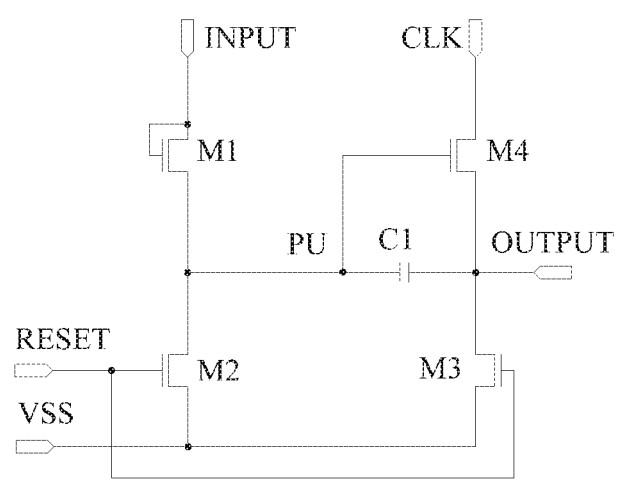
FIG. 3 is a schematic structural diagram of a shift register unit of a gate driving circuit according to an embodiment of the disclosure.

An embodiment of the present disclosure also provides a gate driving circuit including a plurality of cascaded shift register units. FIG. 3 is a schematic structural diagram of a shift register unit of a gate driving circuit according to an embodiment of the disclosure, and as shown in FIG. 3, the shift register unit includes a plurality of thin film transistors, and at least one of the plurality of thin film transistors is the thin film transistor mentioned in the above embodiment.

Specifically, the gate driving circuit includes: a first thin film transistor M1, a second thin film transistor M2, a third thin film transistor M3, a fourth thin film transistor M4, and a storage capacitor C1. A first electrode and a gate of the first thin film transistor M1 are electrically coupled to an input terminal INPUT, a second electrode of the first thin film transistor M1 is electrically coupled to one end of the storage capacitor C1 and a first electrode of the second thin film transistor M2, a gate of the second thin film transistor M2 electrically coupled to a reset signal terminal RESET and a gate of the third thin film transistor M3, a second electrode of the second thin film transistor M2 is electrically coupled to a low level signal terminal VSS and a second electrode of the third thin film transistor M3, a second electrode of the fourth thin film transistor M4 is electrically coupled to a clock signal terminal CLK, and a first electrode of the fourth thin film transistor M4 is electrically coupled to a first electrode of the third thin film transistor M3 and the other end of the storage capacitor C1.

FIG. 4 is a timing diagram of the shift register unit according to an embodiment of the disclosure, as shown in FIG. 4, in a first stage t1, a signal input by the input signal terminal INPUT is at a high level, the signal of the clock signal terminal CLK is at a low level, and the signal provided by the reset signal terminal RESET is at a low level, at this time, the first thin film transistor M1 is turned on, so that a high level signal is transmit to a pull-up node PU. In a second stage t2, the signal input by the input signal terminal INPUT is at a low level, the signal of the clock signal terminal CLK is at a high level, the signal provided by the reset signal terminal RESET is at a low level, and the pull-up node PU continues to be at a high level, so that the fourth thin film transistor M4 is turned on, and the high level signal of the clock signal terminal CLK is output to the output terminal OUTPUT through the fourth thin film transistor M4, and the potential of the pull-up node PU is further pulled up under the bootstrap action of the capacitor C1. In a third stage t3, the signal provided by the input signal terminal INPUT is at a low level signal, the signal of the clock signal terminal CLK is at a low level, the signal provided by the reset signal terminal RESET is at a high level, so that the second thin film transistor M2 and the third thin film transistor M3 are turned on, and a low level signal of the low level signal terminal VSS is transmitted to the pull-up node PU and the output terminal OUTPUT.

Therefore, the magnitude of the signal at the output terminal OUTPUT of the shift register unit is determined by the magnitudes of the signals output by the first thin film transistor M1 and the fourth thin film transistor M4. Therefore, in the present embodiment, each of the first thin film transistor M1 and the fourth thin film transistor M4 may be the thin film transistor provided in the above embodiments, where the width of the conductive channel of the first thin film transistor M1 may range from 550 μm to 650 μm, and the length of the conductive channel of the first thin film transistor M1 may range from 3.5 μm to 4.5 μm; the width of the conductive channel of the fourth thin film transistor M4 may range from 4750 μm to 4850 μm, and the length of the conductive channel of the fourth thin film transistor M4 may range from 3.5 μm to 4.5 μm.

An embodiment of the present disclosure further provides a display substrate, which includes the gate driving circuit described above. The display substrate includes a plurality of gate lines and a plurality of data lines, where the gate lines and the data lines intersect to define a plurality of pixel units, the gate driving circuit is configured for sequentially outputting driving signals to the gate lines so as to enable a plurality of rows of pixel units to be sequentially conducted with the corresponding data lines, and the pixel units display corresponding gray scales according to pixel voltage signals in the data lines.

The thin film transistor, the gate driving circuit and the display substrate provided by the embodiments of the disclosure are particularly suitable for a vehicle-mounted display device.

An embodiment of the disclosure also provides a display device, which includes the above display substrate. The display device can be used for a vehicle-mounted display device.

An embodiment of the present disclosure also provides a manufacturing method of a thin film transistor as shown in FIG. 1 and FIG. 2, the thin film transistor includes: an active layer 1, a source 2 and a drain 3 electrically coupled to the active layer 1, as shown in FIG. 1 and FIG. 2, where a plurality of doped layers 4 are disposed between the source 2 and the active layer 1 and between the drain 3 and the active layer 1, and a resistance of one of the doped layers 4 which is farthest away from the active layer 1 is smaller than that of any other doped layer 4. Further, the source 2 and the drain 3 are both comb-shaped electrodes, the source 2 includes a first comb-handle portion 21 and a plurality of first comb-tooth portions 22 electrically coupled to the first comb-handle portion 21, the drain 3 includes a second comb-handle portion 31 and a plurality of second comb-tooth portions 32 electrically coupled to the second comb-handle portion 31, and the plurality of first comb-tooth portions 22 and the plurality of second comb-tooth portions 32 are alternately arranged at intervals, and as shown in FIG. 5, the manufacturing method in the present embodiment includes a step of:

S501, forming a plurality of doped layers 4 between the source 2 and the active layer 1 and between the drain 3 and the active layer 1, a resistance of one of the doped layers 4 which is farthest away from the active layer 1 is smaller than that of any other doped layer 4.

In the thin film transistor manufactured by the manufacturing method of the present embodiment, since the contents of the dopants in the plurality of doped layers 4 are gradually reduced in the direction from the source and drain to the active layer 1, the resistances of any two adjacent doped layers 4 are similar, the contact resistance between any two adjacent doped layers 4 is relative small, and the on-state current of the thin film transistor is further improved. In addition, the on-state current of the thin film transistor may be increased by increasing the number of the first comb-tooth portions 22 and the second comb-tooth portions 32 to increase the width of the conductive channel, and thus increasing the width-to-length ratio of the conductive channel of the thin film transistor. Alternatively, the on-state current of the thin film transistor may be increased by reducing the interval between the first comb-tooth portion 22 and the second comb-tooth portion 32 which are adjacent to each other, to reduce the length of the conductive channel and thereby increasing the width-to-length ratio of the conductive channel of the thin film transistor.

An embodiment of the present disclosure also provides a manufacturing method of the thin film transistor as shown in FIG. 2, where, as shown in FIG. 2, the thin film transistor includes an active layer 1, a source 2 and a drain 3 electrically coupled to the active layer 1, wherein the source 2 and the drain 3 are both comb-shaped electrodes, the source 2 includes a first comb-handle portion 21 and a plurality of first comb-tooth portions 22 electrically coupled to the first comb-handle portion 21, the drain 3 includes a second comb-handle portion 31 and a plurality of second comb-tooth portions 32 electrically coupled to the second comb-handle portion 31, and the plurality of first comb-tooth portions 22 and the plurality of second comb-tooth portions 32 are alternately arranged at intervals, and as shown in FIG. 6, the manufacturing method in the present embodiment includes a step of:

S601, forming the source 2 and the drain 3 as comb-shaped electrodes, where the source 2 includes a first comb-handle portion 21 and a plurality of first comb-tooth portions 22 electrically coupled to the first comb-handle portion 21, the drain 3 includes a second comb-handle portion 31 and a plurality of second comb-tooth portions 32 electrically coupled to the second comb-handle portion 31, and the plurality of first comb-tooth portions 22 and the plurality of second comb-tooth portions 32 are alternately arranged at intervals.

In the thin film transistor manufactured by the manufacturing method of the present embodiment, the on-state current of the thin film transistor may be increased by increasing the number of the first comb-tooth portions 22 and the second comb-tooth portions 32 to increase the width of the conductive channel, and thus increasing the width-to-length ratio of the conductive channel of the thin film transistor. Alternatively, the on-state current of the thin film transistor may be increased by reducing the interval between the first comb-tooth portion 22 and second comb-tooth portion 32 which are adjacent to each other, to reduce the length of the conductive channel and thereby increasing the width-to-length ratio of the conductive channel of the thin film transistor.

It will be understood that the above embodiments are merely exemplary embodiments employed to illustrate the principles of the present disclosure, and the present disclosure is not limited thereto. It will be apparent to those skilled in the art that various changes and modifications may be made therein without departing from the spirit and scope of the disclosure, and these changes and modifications are to be considered within the scope of the disclosure.

What is claimed is:

1. A thin film transistor, comprising: an active layer; a source and a drain electrically coupled to the active layer, and a plurality of doped layers respectively located between the source and the active layer and between the drain and the active layer, and a resistance of one of the doped layers of the plurality of doped layers farthest away from the active layer is smaller than that of any other doped layer of the plurality of doped layers, wherein an orthographic projection of each doped layer on the active layer coincides with orthographic projection of the source or the drain on the active layer respectively, and completely falls within the active layer.

2. The thin film transistor of claim 1, wherein resistances of the plurality of doped layers increase gradually in a direction from the source and the drain towards the active layer.

3. The thin film transistor of claim 1, wherein contents of dopants in the plurality of doped layers are decreased gradually in a direction from the source and the drain towards the active layer.

4. The thin film transistor of claim 2, wherein contents of dopants in the plurality of doped layers are decreased gradually in a direction from the source and the drain towards the active layer.

5. The thin film transistor of claim 1, wherein a thickness of each of the plurality of doped layers ranges from 100 Å to 200 Å.

6. The thin film transistor of claim 4, wherein a thickness of each doped layer ranges from 100 Å to 200 Å.

7. The thin film transistor of claim 1, wherein a number of the plurality of doped layers disposed between the source and the active layer and between the drain and the active layer respectively is three.

8. The thin film transistor of claim 6, wherein a number of the plurality of doped layers disposed between the source and the active layer and between the drain and the active layer respectively is three.

9. The thin film transistor of claim 1, wherein the source and the drain are both comb-shaped electrodes, the source comprises a first comb-handle portion and a plurality of first comb-tooth portions electrically coupled to the first comb-handle portion, the drain comprises a second comb-handle portion and a plurality of second comb-tooth portions electrically coupled to the second comb-handle portion, and the plurality of first comb-tooth portions and the plurality of second comb-tooth portions are alternately arranged at intervals.

10. The thin film transistor of claim 8, wherein the source and the drain are both comb-shaped electrodes, the source comprises a first comb-handle portion and a plurality of first comb-tooth portions electrically coupled to the first comb-handle portion, the drain comprises a second comb-handle portion and a plurality of second comb-tooth portions electrically coupled to the second comb-handle portion, and the plurality of first comb-tooth portions and the plurality of second comb-tooth portions are alternately arranged at intervals.

11. The thin film transistor of claim 9, wherein an interval between the first comb-tooth portion and the second comb-tooth portion which are adjacent to each other ranges from 3.5 micrometers to 4.5 micrometers.

12. A gate driving circuit comprising a plurality of thin film transistors, at least one of the plurality of thin film transistors being the thin film transistor of claim 1.

13. A display substrate, comprising the gate driver circuit of claim 12.

14. A display device, comprising the display substrate of claim 13.

15. A manufacturing method of the thin film transistor of claim 1, comprising:

forming the plurality of doped layers between the source and the active layer and between the drain and the active layer respectively, wherein a resistance of one of the doped layers farthest away from the active layer is smaller than that of any other doped layer.

16. The method of claim 15, further comprising:

forming the source and the drain as comb-shaped electrodes, wherein the source and the drain are both comb-shaped electrodes, the source comprises a first comb-handle portion and a plurality of first comb-tooth portions electrically coupled to the first comb-handle portion, the drain comprises a second comb-handle portion and a plurality of second comb-tooth portions electrically coupled to the second comb-handle portion, and the plurality of first comb-tooth portions and the plurality of second comb-tooth portions are alternately arranged at intervals.

* * * * *